US009666269B2

(12) United States Patent
Shankar et al.

(10) Patent No.: US 9,666,269 B2
(45) Date of Patent: May 30, 2017

(54) COLLISION DETECTION SYSTEMS FOR DETECTING READ-WRITE COLLISIONS IN MEMORY SYSTEMS AFTER WORD LINE ACTIVATION, AND RELATED SYSTEMS AND METHODS

(71) Applicant: QUALCOMM Incorporated, San Diego, CA (US)

(72) Inventors: Harish Shankar, Raleigh, NC (US); Manish Garg, Cary, NC (US); Joshua Lance Puckett, Cary, NC (US); Rahul Krishnakumar Nadkarni, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/857,512

(22) Filed: Sep. 17, 2015

(65) Prior Publication Data
US 2016/0240244 A1    Aug. 18, 2016

Related U.S. Application Data

(60) Provisional application No. 62/115,966, filed on Feb. 13, 2015.

(51) Int. Cl.
| | | |
|---|---|---|
| G11C 11/00 | (2006.01) | |
| G11C 11/419 | (2006.01) | |
| G11C 7/10 | (2006.01) | |
| G11C 8/16 | (2006.01) | |

(52) U.S. Cl.
CPC .......... *G11C 11/419* (2013.01); *G11C 7/1075* (2013.01); *G11C 8/16* (2013.01)

(58) Field of Classification Search
CPC ...... G11C 11/41; G11C 11/412; G11C 11/413
USPC .................................. 365/154, 156
See application file for complete search history.

(56) References Cited

U.S. PATENT DOCUMENTS

| | | |
|---|---|---|
| 7,417,907 B1 | 8/2008 | Liu et al. |
| 8,027,206 B2 | 9/2011 | Yoon et al. |
| 8,432,756 B1 | 4/2013 | Sullivan et al. |
| 8,451,679 B1 | 5/2013 | Sharpe-Geisler et al. |
| 2014/0119102 A1* | 5/2014 | Shankar ................ G11C 5/063 365/154 |

\* cited by examiner

*Primary Examiner* — Huan Hoang
(74) *Attorney, Agent, or Firm* — Withrow & Terranova, PLLC

(57) ABSTRACT

Collision detection systems for detecting read-write collisions in memory systems after word line activation are disclosed. In one aspect, a collision detection system is provided. The collision detection system includes a collision detection circuit for each bit cell row of memory array. Each collision detection circuit is configured to receive a write and read word line signal corresponding to the bit cell row. The collision detection circuit is configured to detect a write and read word line signal pair being active for a write and read operation for the same bit cell row. The collision detection circuit is configured to generate a collision detection signal to notify clients associated with the memory system that a read-write collision occurred. Detecting the read-write collisions after read word line activation reduces or avoids overhead delays in the read path, as opposed to detecting read-write collisions prior to activation of the read word line.

19 Claims, 8 Drawing Sheets

US 9,666,269 B2

COLLISION DETECTION SYSTEMS FOR DETECTING READ-WRITE COLLISIONS IN MEMORY SYSTEMS AFTER WORD LINE ACTIVATION, AND RELATED SYSTEMS AND METHODS

PRIORITY CLAIM

The present application claims priority under 35 U.S.C. §119(e) to U.S. Patent Application Ser. No. 62/115,966 filed on Feb. 13, 2015 and entitled "COLLISION DETECTION CIRCUITS AND CLAMPING CIRCUITS FOR DETECTING AND PREVENTING SIMULTANEOUS READ AND WRITE OPERATIONS IN MEMORY SYSTEMS AFTER WORD LINE ACTIVATION, AND RELATED SYSTEMS AND METHODS," the contents of which is incorporated herein by reference in its entirety.

BACKGROUND

I. Field of the Disclosure

The technology of the disclosure relates generally to memory systems, and particularly to detecting and preventing collisions of read and write operations within memory systems.

II. Background

Processor-based computer systems include memory for data storage. Different types of memory exist, each possessing certain unique features. For example, static random access memory (SRAM) is a type of memory that can be employed in processor-based computer systems. SRAM can store data without the need to periodically refresh the memory, unlike dynamic random access memory (DRAM) for example. An SRAM contains a plurality of SRAM bit cells (also referred to as "bit cells") organized in rows and columns in an SRAM array. For any given row in an SRAM array, each column of the SRAM array includes an SRAM bit cell in which a single data value or bit is stored. Read and write operations are performed on a particular SRAM bit cell using read and write word lines which correspond to the SRAM bit cell row that includes the particular SRAM bit cell.

In this regard, some computer architectures allow read and write operations to be issued concurrently to an SRAM array to increase throughput performance of the memory. When a read and a write operation are issued concurrently to the same SRAM bit cell row in the SRAM array, an error may occur. This is known as a "read-write collision." In a read-write collision, the write operation may begin writing data to the SRAM bit cell before the read operation is completed. Thus, the read operation may result in a read failure, as the data read from the SRAM bit cell may be an unknown value falling in-between the previously stored data and the newly written data. Notably, processor-based computer systems can employ circuits that are designed to detect and prevent read-write collisions in an SRAM array. However, circuits used to detect and prevent read-write collisions in an SRAM array commonly employ logic configured to detect read-write collisions prior to activation of a read word line. Because such logic is configured to detect read-write collisions prior to activation of the read word line, the logic generates overhead delays during each read operation, which decreases the read performance of the SRAM array.

SUMMARY OF THE DISCLOSURE

Aspects disclosed in the detailed description include collision detection systems for detecting read-write collisions in memory systems after word line activation. Related systems and methods are also disclosed. In one aspect, a collision detection system is provided for a memory array that includes bit cells having at least one read port and one write port to allow simultaneous read and write operations to be performed. The collision detection system includes a collision detection circuit for each corresponding bit cell row of the memory array. Each collision detection circuit is configured to receive a write word line signal and a read word line signal corresponding to the bit cell row for write and read operations, respectively. The collision detection circuit is configured to detect a write word line signal being active while a read word line signal is also active for a write and read operation for the same bit cell row (i.e., memory address) in the memory array. In response, the collision detection circuit is configured to generate a collision detection signal to notify a client associated with the memory system that a read-write collision occurred, and thus, that the read operation should be treated as a failed operation. The requesting client can then reissue the read operation to the memory system, if desired, in response to the read-write collision notification. Detecting the read-write collisions after the read word line is activated reduces or avoids overhead delays in the read path of the memory array, as opposed to detecting the read-write collisions prior to activation of the read word line. In other words, detecting the read-write collisions after activation of the read word line results in a read operation associated with the read-write collision being reissued, thus delaying the read path for that operation. However, detecting the read-write collision prior to activation of the read word line delays the read path for every read operation. Thus, employing the collision detection system mitigates errors caused by read-write collisions in a memory system without decreasing performance of the memory system during every read operation.

In this regard, in one aspect, a collision detection system is provided. The collision detection system comprises one or more collision detection circuits, wherein each collision detection circuit of the one or more collision detection circuits corresponds to a bit cell row in a memory array. Each collision detection circuit is configured to receive a write word line signal corresponding to the bit cell row. Each collision detection circuit is further configured to receive a read word line signal corresponding to the bit cell row. Each collision detection circuit is further configured to generate a collision detection signal in response to the write word line signal having an active state when the read word line signal also has an active state.

In another aspect, a method for detecting read-write collisions is provided. The method comprises receiving a write word line signal corresponding to a bit cell row. The method further comprises receiving a read word line signal corresponding to the bit cell row. The method further comprises generating a collision detection signal in response to the write word line signal having an active state when the read word line signal also has an active state.

In another aspect, a collision detection system is provided. The collision detection system comprises means for receiving a write word line signal corresponding to a bit cell row. The collision detection system further comprises means for receiving a read word line signal corresponding to the bit cell row. The collision detection system further comprises means for generating a collision detection signal in response to the write word line signal having an active state when the read word line signal also has an active state.

DETAILED DESCRIPTION

Figure 1:
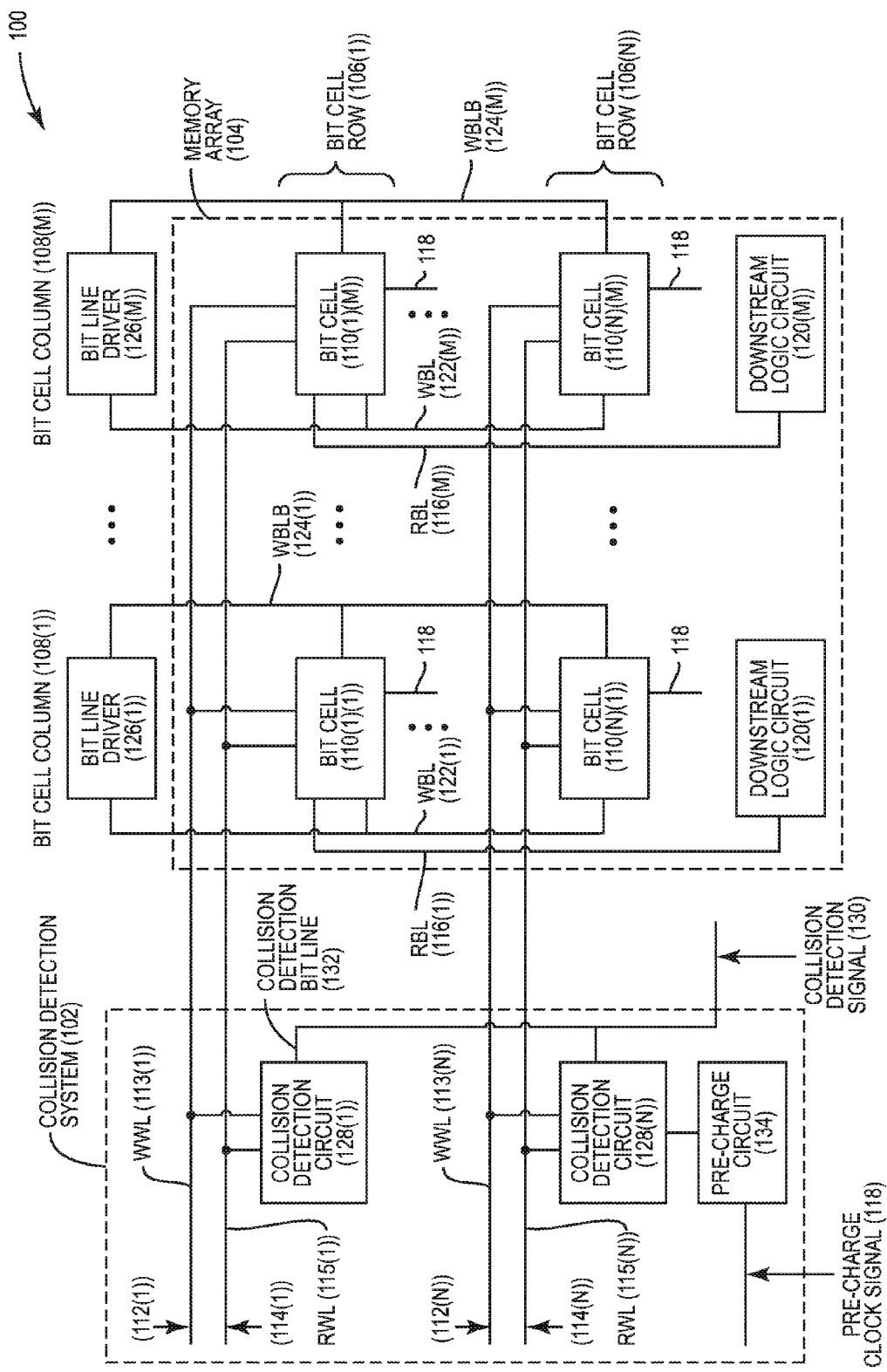
FIG. 1 is a block diagram of an exemplary memory system employing an exemplary collision detection system configured to detect a read-write collision at a memory address in a memory array after word line activation without decreasing performance of the memory system during every read operation.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include collision detection systems for detecting read-write collisions in memory systems after word line activation. Related systems and methods are also disclosed. In one aspect, a collision detection system is provided for a memory array that includes bit cells having at least one read port and one write port to allow simultaneous read and write operations to be performed. The collision detection system includes a collision detection circuit for each corresponding bit cell row of the memory array. Each collision detection circuit is configured to receive a write word line signal and a read word line signal corresponding to the bit cell row for write and read operations, respectively. The collision detection circuit is configured to detect a write word line being active while a read word line signal is also active for a write and read operation for the same bit cell row (i.e., memory address) in the memory array. In response, the collision detection circuit is configured to generate a collision detection signal to notify a client associated with the memory system that a read-write collision occurred, and thus, that the read operation should be treated as a failed operation. The requesting client can then reissue the read operation to the memory system, if desired, in response to the read-write collision notification. Detecting the read-write collisions after the read word line is activated reduces or avoids overhead delays in the read path of the memory array, as opposed to detecting the read-write collisions prior to activation of the read word line. In other words, detecting the read-write collisions after activation of the read word line results in a read operation associated with the read-write collision being reissued, thus delaying the read path for that operation. However, detecting the read-write collision prior to activation of the read word line delays the read path for every read operation. Thus, employing the collision detection system mitigates errors caused by read-write collisions in a memory system without decreasing performance of the memory system during every read operation.

In this regard, FIG. 1 illustrates an exemplary memory system 100 employing an exemplary collision detection system 102 configured to detect read-write collisions after word line activation without decreasing performance of the memory system 100 during every read operation. In this aspect, the memory system 100 includes a memory array 104 organized into bit cell rows 106(1)-106(N) and bit cell columns 108(1)-108(M) of static random access memory (SRAM) bit cells 110(1)(1)-110(N)(M) (also referred to herein as "bit cells 110(1)(1)-110(N)(M)"). Notably, while the memory system 100 in this aspect employs the SRAM bit cells 110(1)(1)-110(N)(M), other aspects may employ alternative types of bit cells. Each bit cell 110(1)(1)-110(N)(M) corresponds to a memory address (not shown), and is configured to receive a write word line signal 112(1)-112(N) from a write word line (WWL) 113(1)-113(N) and a read word line signal 114(1)-114(N) from a read word line (RWL) 115(1)-115(N) corresponding to the bit cell row 106(1)-106(N). Each bit cell 110(1)(1)-110(N)(M) is also configured to drive a read bit line (RBL) 116(1)-116(M) corresponding to the bit cell column 108(1)-108(M) to an evaluate state in response to a pre-charge clock signal 118 and the corresponding read word line signal 114(1)-114(N). Further, each bit cell 110(1)(1)-110(N)(M) is configured to provide a stored bit to the corresponding read bit line 116(1)-116(M) in response to activation of the corresponding read word line 115(1)-115(N) (i.e., the corresponding read word line signal 114(1)-114(N) transitioning to an active state) and the evaluate state of the pre-charge clock signal 118. Data from the read bit line 116(1)-116(M) is provided to corresponding downstream logic circuits 120(1)-120(M). Each bit cell 110(1)(1)-110(N)(M) is also configured to store a value related to a corresponding write bit line (WBL) 122(1)-122(M) and complement write bit line (WBLB) 124(1)-124(M) from a corresponding bit line driver 126(1)-126(M) in response to activation of the corresponding write word line 113(1)-113(N) (i.e., the corresponding write word line signal 112(1)-112(N) transitioning to an active state).

With continuing reference to FIG. 1, the memory system 100 employs the collision detection system 102 to detect read-write collisions after word line activation. The collision detection system 102 includes a collision detection circuit 128(1)-128(N) for each corresponding bit cell row 106(1)-106(N). Each collision detection circuit 128(1)-128(N) is configured to receive the corresponding write word line signal 112(1)-112(N) and read word line signal 114(1)-114(N). Notably, each collision detection circuit 128(1)-128(N) is sometimes referred to herein as a means for receiving the write word line signal 112(1)-112(N) and a means for receiving the read word line signal 114(1)-114(N). In response to a corresponding write and read word line signal 112(1)-112(N), 114(1)-114(N) pair both being in an active state at the same point in time, the corresponding collision detection circuit 128(1)-128(N) is configured to generate a collision detection signal 130 on a collision detection bit line 132 of the collision detection system 102. Notably, each collision detection circuit 128(1)-128(N) is sometimes referred to herein as a means for generating the collision detection signal 130 in response to the write word line signal 112(1)-112(N) having an active state when the read word line signal 114(1)-114(N) also has an active state.

In other words, each collision detection circuit 128(1)-128(N) is configured to detect when a read and write operation are issued for the same memory address, wherein at some point in time the read and write word line signals 114(1)-114(N), 112(1)-112(N) both have an active state (i.e., a read-write collision). Notably, the write word line signal 112(1)-112(N) and the read word line signal 114(1)-114(N) received by each collision detection circuit 128(1)-128(N) are provided to the corresponding bit cell 110(1)(1)-110(N)(M) without insertion of additional logic stages in this example. Further, the collision detection system 102 is configured to detect read-write collisions following activation of the read and write word lines 115(1)-115(N), 113(1)-113(N), as opposed to prior to activation. Thus, the collision detection system 102 is configured to detect read-write collisions in the memory system 100 without delaying the read word line signal 114(1)-114(N) during every read operation that would otherwise decrease performance of the memory system 100.

With continuing reference to FIG. 1, the collision detection system 102 may also be configured to use the collision detection signal 130 to notify a client that issued the read operation that caused the detected read-write collision that a read-write collision occurred for the read operation. In response, as an example, the client may reissue the read operation. In other words, a read operation coinciding with a read-write collision may result in a read failure. Thus, the collision detection signal 130 may be used to notify clients associated with the memory system 100 of a read-write collision, which allows a read operation that may have failed due to the read-write collision to be re-issued such that it may have a chance to successfully complete. Notably, the collision detection system 102 is sometimes referred to herein as a means for providing the collision detection signal 130 to a client.

With continuing reference to FIG. 1, the collision detection system 102 in this aspect also includes a pre-charge circuit 134 that is configured to drive the collision detection signal 130 to an inactive state based on the pre-charge clock signal 118. Notably, the pre-charge circuit 134 is sometimes referred to herein as a means for driving the collision detection signal 130 to an inactive state in response to the pre-charge clock signal 118. In this manner, the pre-charge circuit 134 provides the collision detection system 102 with a mechanism to drive the collision detection signal 130 to an inactive state so as to notify components associated with the memory system 100 when no read-write collision is present.

Figure 2:
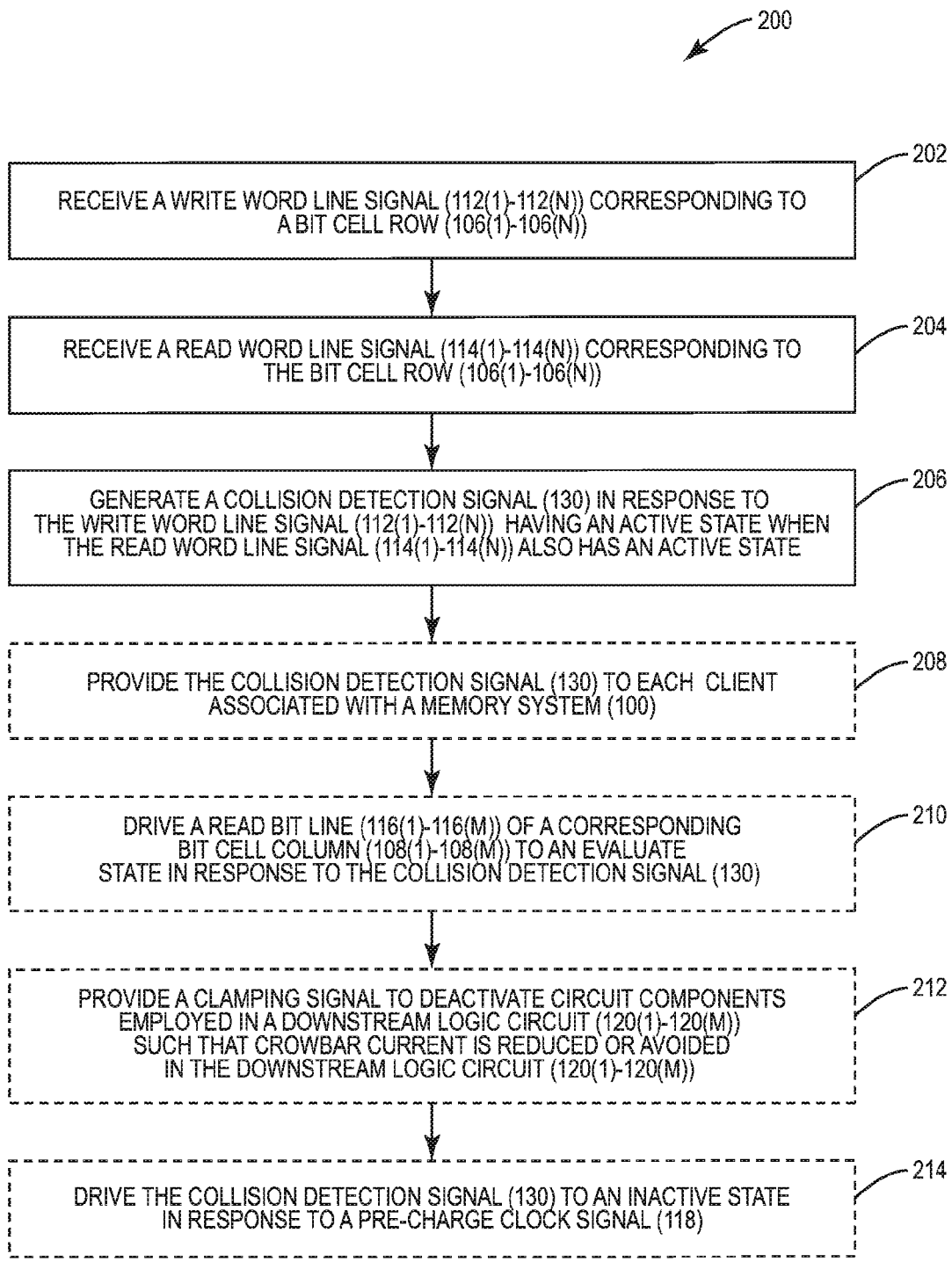
FIG. 2 is a flowchart illustrating an exemplary process employed by the memory system in FIG. 1 for detecting read-write collisions at a memory address in a memory array after word line activation without decreasing performance of the memory system during every read operation.

FIG. 2 illustrates a flowchart of an exemplary process 200 that may be employed by the collision detection system 102 in FIG. 1 to detect read-write collisions in the memory system 100 without decreasing performance of the memory system 100 during every read operation. The process 200 includes receiving the write word line signal 112(1)-112(N) corresponding to the bit cell row 106(1)-106(N) (block 202). The process 200 also includes receiving the read word line signal 114(1)-114(N) corresponding to the bit cell row 106(1)-106(N) (block 204). Further, the process 200 includes generating the collision detection signal 130 on the collision detection bit line 132 corresponding to the collision detection system 102 in response to the write word line signal 112(1)-112(N) having an active state while the read word line signal 114(1)-114(N) also has an active state (block 206).

With continuing reference to FIG. 2, the process 200 may also provide the collision detection signal 130 to each client associated with the memory system 100 so as to notify the client that the read operation issued during a read-write collision may be re-issued (block 208). Further, as discussed in greater detail below, the process 200 may include driving the read bit line 116(1)-116(M) of the corresponding bit cell column 108(1)-108(M) to an evaluate state in response to the collision detection signal 130 so as to reduce power consumption associated with the read-write collision (block 210). As also discussed further below, the process 200 may also include providing a clamping signal to deactivate circuit components employed in the downstream logic circuit 120(1)-120(M) such that crowbar current is reduced or avoided in the downstream logic circuit 120(1)-120(M), which reduces power consumption (block 212). The process 200 may also drive the collision detection signal 130 to an inactive state in response to the pre-charge clock signal 118 (block 214). By employing the process 200, the collision detection system 102 may be used to mitigate errors caused by read-write collisions without decreasing performance of the memory system 100 during every read operation, while also reducing power consumption of the memory system 100.

Figure 3:
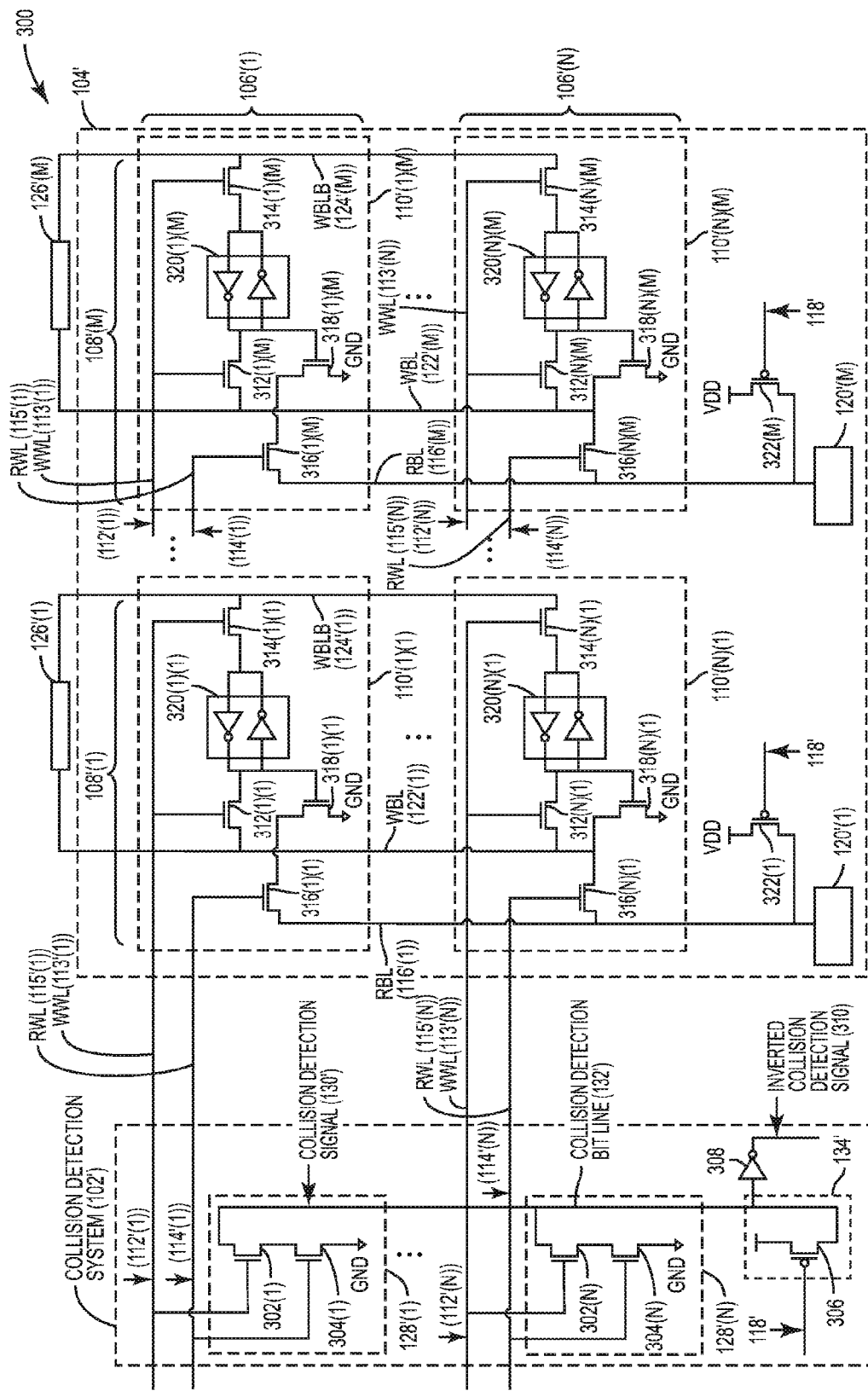
FIG. 3 is a circuit diagram of an exemplary memory system illustrating more detail of an exemplary collision detection system configured to detect read-write collisions at memory addresses.

In addition to the aspect illustrated in FIG. 1, more detailed aspects will now be described. In this regard, FIG. 3 illustrates an exemplary memory system 300 employing an exemplary collision detection system 102'. Notably, elements associated with the memory system 100 in FIG. 1 have an associated number "X," while similar elements in the memory system 300 in FIG. 3 have an associated number "X'," and thus will not be re-described herein.

In this aspect, each collision detection circuit 128'(1)-128'(N) in the collision detection system 102' includes a corresponding first n-type metal oxide semiconductor (NMOS) transistor 302(1)-302(N) and a second NMOS transistor 304(1)-304(N). Each first NMOS transistor 302(1)-302(N) includes a gate configured to receive the corresponding write word line signal 112'(1)-112'(N), a source coupled to a drain of the corresponding second NMOS transistor 304(1)-304(N), and a drain coupled to the collision detection bit line 132'. In addition to the drain referenced above, each second NMOS transistor 304(1)-304(N) includes a gate configured to receive the corresponding read word line signal 114'(1)-114'(N) and a source configured to receive a ground voltage from a ground supply GND. The collision detection system 102' also employs the pre-charge circuit 134' employing a p-type metal oxide semiconductor (PMOS) transistor 306. The PMOS transistor 306 includes a gate configured to receive the pre-charge clock signal 118', a source configured to receive a supply voltage from a voltage supply VDD, and a drain coupled to the collision detection bit line 132'.

With continuing reference to FIG. 3, if a read operation and a write operation are issued for an address corresponding to the bit cell row 106'(1) such that the write and read operations overlap, both the write word line signal 112'(1) and the read word line signal 114'(1) are driven to a logic high ('1') value. The logic high ('1') value of the write word line signal 112'(1) activates the first NMOS transistor 302(1), while the logic high ('1') value of the read word line signal 114'(1) activates the second NMOS transistor 304(1). In response to activation of both the first and second NMOS transistors 302(1), 304(1), the ground voltage is provided from the ground supply GND to the collision detection bit line 132'. Thus, the collision detection signal 130' is driven to the ground voltage (i.e., a logic low ('0') value) in response to the read-write collision associated with the bit cell row 106'(1). Notably, because the collision detection circuits 128'(1)-128'(N) are configured to drive the collision detection signal 130' to a logic low ('0') value in response to a read-write collision, the collision detection system 102' also includes an inverter 308 configured to receive the collision detection signal 130' and provide an inverted collision detection signal 310. Thus, the inverted collision detection signal 310 may be provided to each client corresponding to each read word line signal 114'(1)-114'(N) so as to notify the client that the read operation issued during a read-write collision may be re-issued.

With continuing reference to FIG. 3, the collision detection system 102' in this aspect is configured to work with the memory array 104' employing bit cells 110'(1)(1)-110'(N)(M). In this manner, each bit cell 110'(1)(1)-110'(N)(M) includes a first write transistor 312(1)(1)-312(N)(M) with a gate configured to receive the write word line signal 112'(1)-112'(N) and a drain coupled to the write bit line 122'(1)-122'(M). Each bit cell 110'(1)(1)-110'(N)(M) also includes a second write transistor 314(1)(1)-314(N)(M) with a gate configured to receive the write word line signal 112'(1)-112'(N) and a drain coupled to the complement write bit line 124'(1)-124'(M). Further, each bit cell 110'(1)(1)-110'(N)(M) includes a first read transistor 316(1)(1)-316(N)(M) with a source coupled to the read bit line 116'(1)-116'(M), and a gate configured to receive the read word line signal 114'(1)-114'(N). Each bit cell 110'(1)(1)-110'(N)(M) also includes a second read transistor 318(1)(1)-318(N)(M) with a drain coupled to a drain of the first read transistor 316(1)(1)-316(N)(M), and a source coupled to the ground supply GND. Each bit cell 110'(1)(1)-110'(N)(M) also includes cross-coupled inverters 320(1)(1)-320(N)(M) coupled to a source of the first write transistor 312(1)(1)-312(N)(M), a source of the second write transistor 314(1)(1)-314(N)(M), and a gate of the second read transistor 318(1)(1)-318(N)(M). Further, each read bit line 116'(1)-116'(M) is coupled to a PMOS pre-charge transistor 322(1)-322(M) that is configured to pre-charge the corresponding read bit line 116'(1)-116'(M) to a pre-charge state in response to the pre-charge clock signal 118'.

Figure 4:
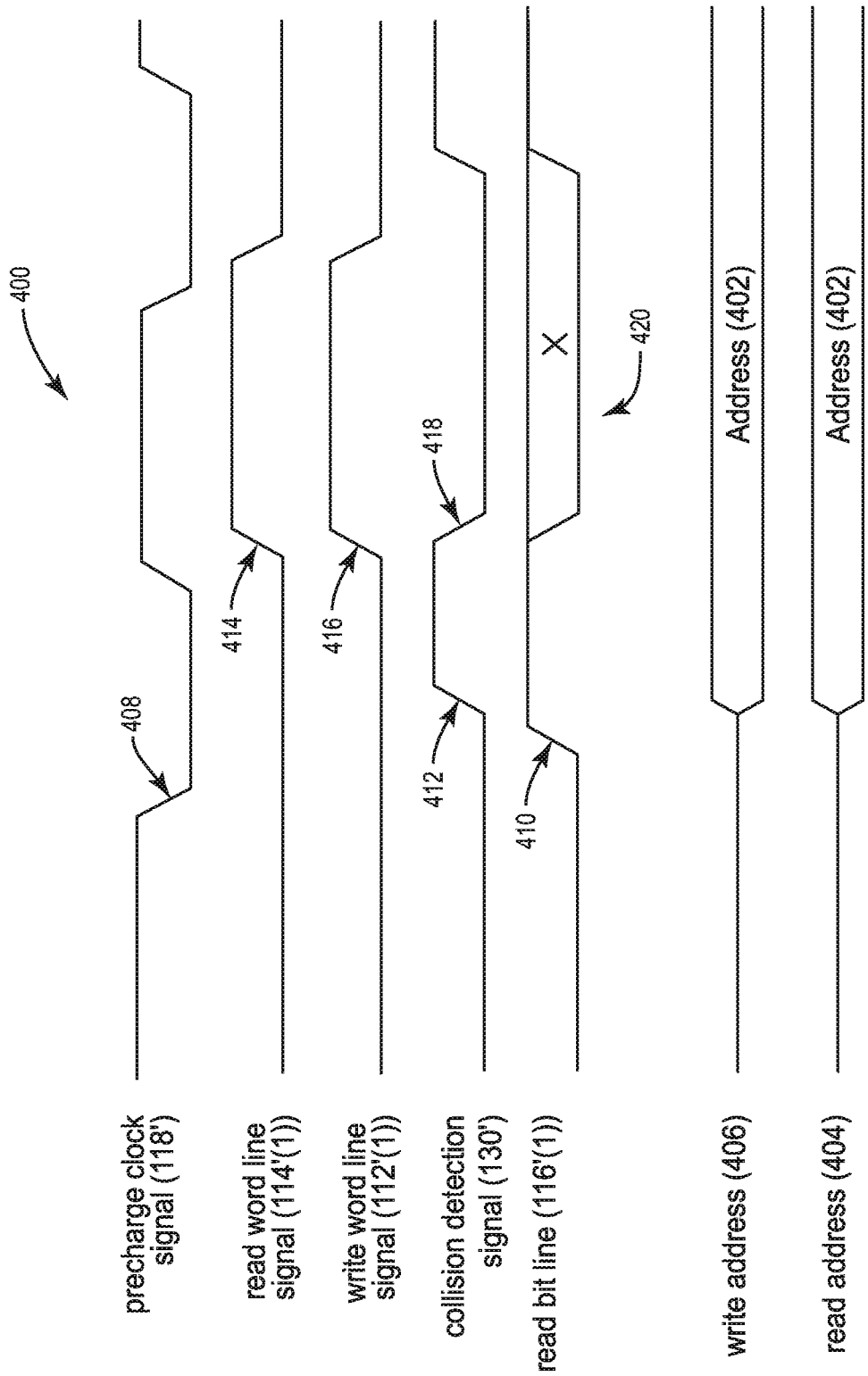
FIG. 4 is a timing diagram illustrating exemplary timings of signals in the memory system in FIG. 3 in response to a read-write collision at a memory address.

As a non-limiting example, FIG. 4 illustrates an exemplary timing diagram 400 of signals generated by the memory system 300 in FIG. 3 in response to a read-write collision. Notably, in this example, the read-write collision corresponds to a read operation and a write operation issued for a same memory address 402 corresponding to bit cell 110'(1)(1) (i.e., where the read and write operations overlapped at some point in time). Thus, a read address 404 and a write address 406 are both equal to the memory address 402. In preparation for receiving the read operation, a falling transition 408 of the pre-charge clock signal 118' activates the PMOS pre-charge transistor 322(1), and thus pre-charges the read bit line 116'(1) to a logic high ('1') value (arrow 410). A logic low ('0') value of the pre-charge clock signal 118' also activates the PMOS transistor 306 in the pre-charge circuit 134' to pre-charge the collision detection signal 130' to a logic high ('1') value (arrow 412). A read operation causes a rising transition 414 of the read word line signal 114'(1) while a write operation causes a rising transition 416 of the write word line signal 112'(1).

With continuing reference to FIG. 4, a logic high ('1') value of the write word line signal 112'(1) and the read word line signal 114'(1) activates the first and second NMOS transistors 302(1), 304(1), respectively, in the collision detection circuit 128'(1), thus driving the collision detection signal 130' to a logic low ('0') value (arrow 418). The inverter 308 in the collision detection system 102' inverts the collision detection signal 130' and drives the inverted collision detection signal 310 to a logic high ('1') value (not shown). As discussed in greater detail below, in response to the read-write collision, an unknown value X is provided to the read bit line 116'(1) (arrow 420), which renders the read operation a failure, as the value stored in the bit cell 110'(1)(1) cannot be read. However, the inverted collision detection signal 310 may be provided to the client that issued the failed read operation during the read-write collision such that the read operation may be re-issued. Thus, employing the collision detection system 102' mitigates errors caused by read-write collisions in the memory system 300 without decreasing performance of the memory system 300 during every read operation.

As noted above with reference to FIG. 4, the read-write collision in the memory system 300 in FIG. 3 causes an unknown value X to be provided to the read bit line 116'(1), thus leading to a read failure. Details of the causes of this type of read failure in the memory system 300 are now described. As a non-limiting example, a logic high ('1') value may be stored in the bit cell 110'(1)(1). When a read operation for the bit cell 110'(1)(1) is issued, the first and second read transistors 316(1)(1), 318(1)(1) are activated, which begins driving the read bit line 116'(1) to a voltage equivalent to a logic low ('0') value. However, if a write operation to write a logic low ('0') value to the bit cell 110'(1)(1) is issued such that the write operation overlaps in time with the read operation, the voltage of the bit cell 110'(1)(1) will decrease to a voltage equivalent to a logic low ('0') value. In response to a logic low ('0') value in the bit cell 110'(1)(1), the second read transistor 318(1)(1) is deactivated before the voltage of the read bit line 116'(1) is equivalent to a logic low ('0') value. Thus, rather than the read bit line 116'(1) having a voltage equivalent to a logic low ('0') value, the voltage of the read bit line 116'(1) is between the equivalent of a logic high ('1') value and a logic low ('0') value (i.e., an unknown X value). Therefore, the unknown value X on the read bit line 116'(1) cannot be used to complete the read operation, resulting in a read failure.

Figure 5:
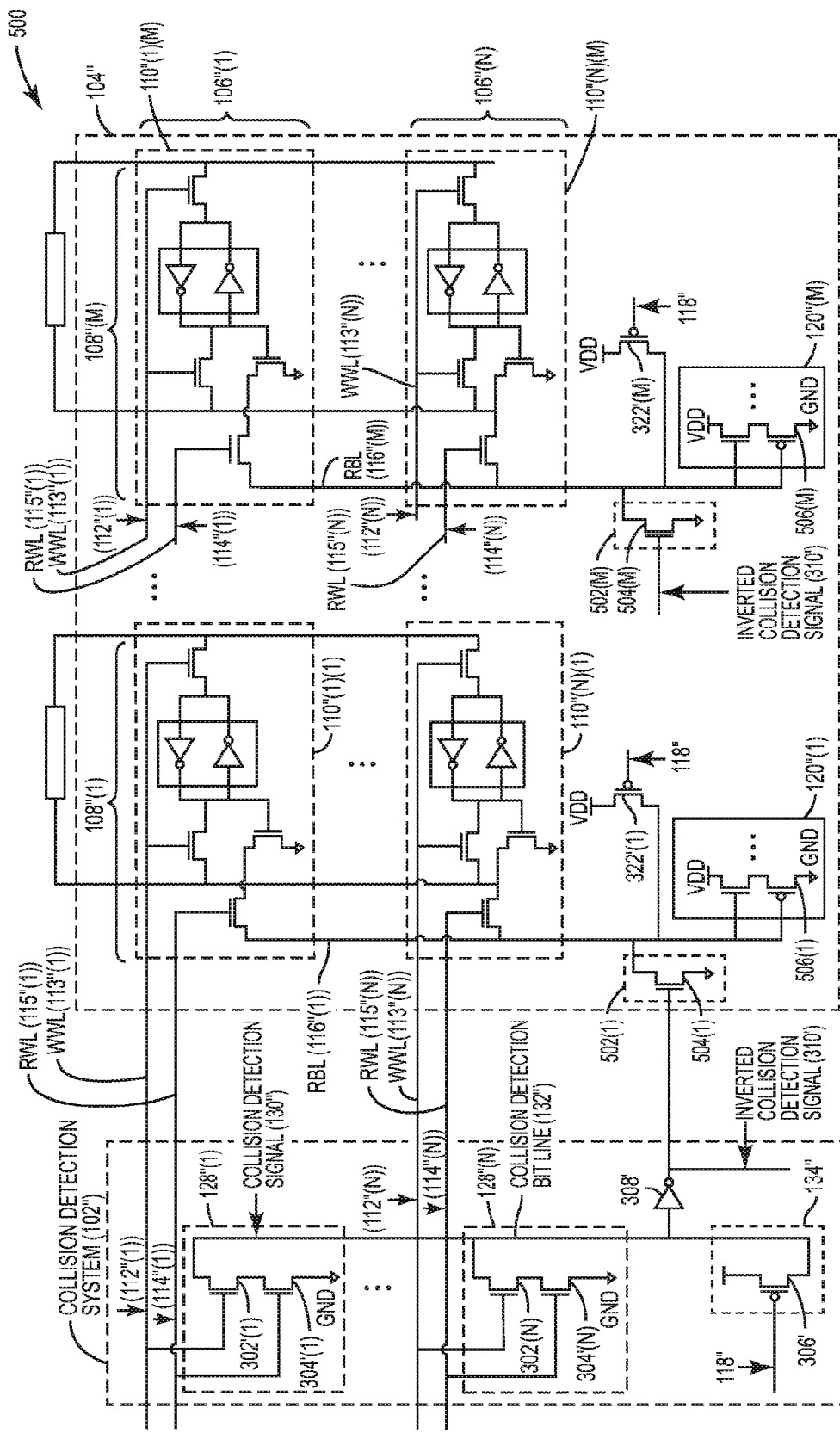
FIG. 5 is a circuit diagram of an exemplary memory system employing an exemplary collision detection system configured to detect read-write collisions at a memory address that additionally employs clamping circuits to reduce power consumption associated with the read-write collisions.

In this regard, FIG. 5 illustrates an exemplary memory system 500 employing an exemplary collision detection system 102" that employs clamping circuits 502(1)-502(M) configured to prevent errors associated with the read-write collisions. Notably, elements associated with the memory system 300 in FIG. 3 have an associated number "X" or "X'," while similar elements in the memory system 500 in FIG. 5 have an associated number "X'" or "X"," respectively, and thus will not be re-described herein.

With continuing reference to FIG. 5, the collision detection system 102" employs the clamping circuits 502(1)-502(M) corresponding to each bit cell column 108"(1)-108"(M). Each clamping circuit 502(1)-502(M) is configured to drive the corresponding read bit line 116"(1)-116"(M) to an evaluate state (also referred to as "clamping" the read bit line 116"(1)-116"(M)) in response to the inverted collision detection signal 310'. In other words, as a non-limiting example, in response to activation of the read and write word lines 115"(1)-115"(N), 113" (1)-113" (N), the inverted collision detection signal 310' causes the clamping circuit 502(1) to "clamp" the read bit line 116"(1) to a known logic low ('0') value. Notably, each clamping circuit 502(1)-502(M) is sometimes referred to herein as a means for driving the corresponding read bit line 116"(1)-116"(M) to an evaluate state in response to the collision detection signal 130". In this aspect, each clamping circuit 502(1)-502(M) includes an NMOS transistor 504(1)-504(M) with a source configured to receive the ground voltage, a gate configured to receive the inverted collision detection signal 310', and a drain coupled to the read bit line 116"(1)-116"(M) of the corresponding bit cell column 108"(1)-108"(M). Thus, clamping the read bit line 116"(1)-116"(M) in this aspect drives the read bit line 116"(1)-116"(M) to a logic low ('0') value, which prevents an unknown value X from being provided to the downstream logic circuit 120"(1)-120"(M).

With continuing reference to FIG. 5, clamping the read bit line 116"(1)-116" (M) in this manner affects the power consumption of the memory system 500. As a non-limiting example, without clamping the read bit line 116"(1)-116" (M), an unknown value X is provided to inverters 506(1)-506(M) in the corresponding downstream logic circuit 120"(1)-120"(M). In response to receiving the unknown value X, PMOS and NMOS transistors within the inverters 506(1)-506(M) may be partially activated such that the voltage supply VDD is coupled to the ground supply GND. This coupling causes crowbar current to flow in the corresponding inverter 506(1)-506(M), thus increasing power consumption. Therefore, employing the clamping circuits 502(1)-502(M) reduces or avoids such crowbar current, which reduces the power consumption of the memory system 500.

Figure 6:
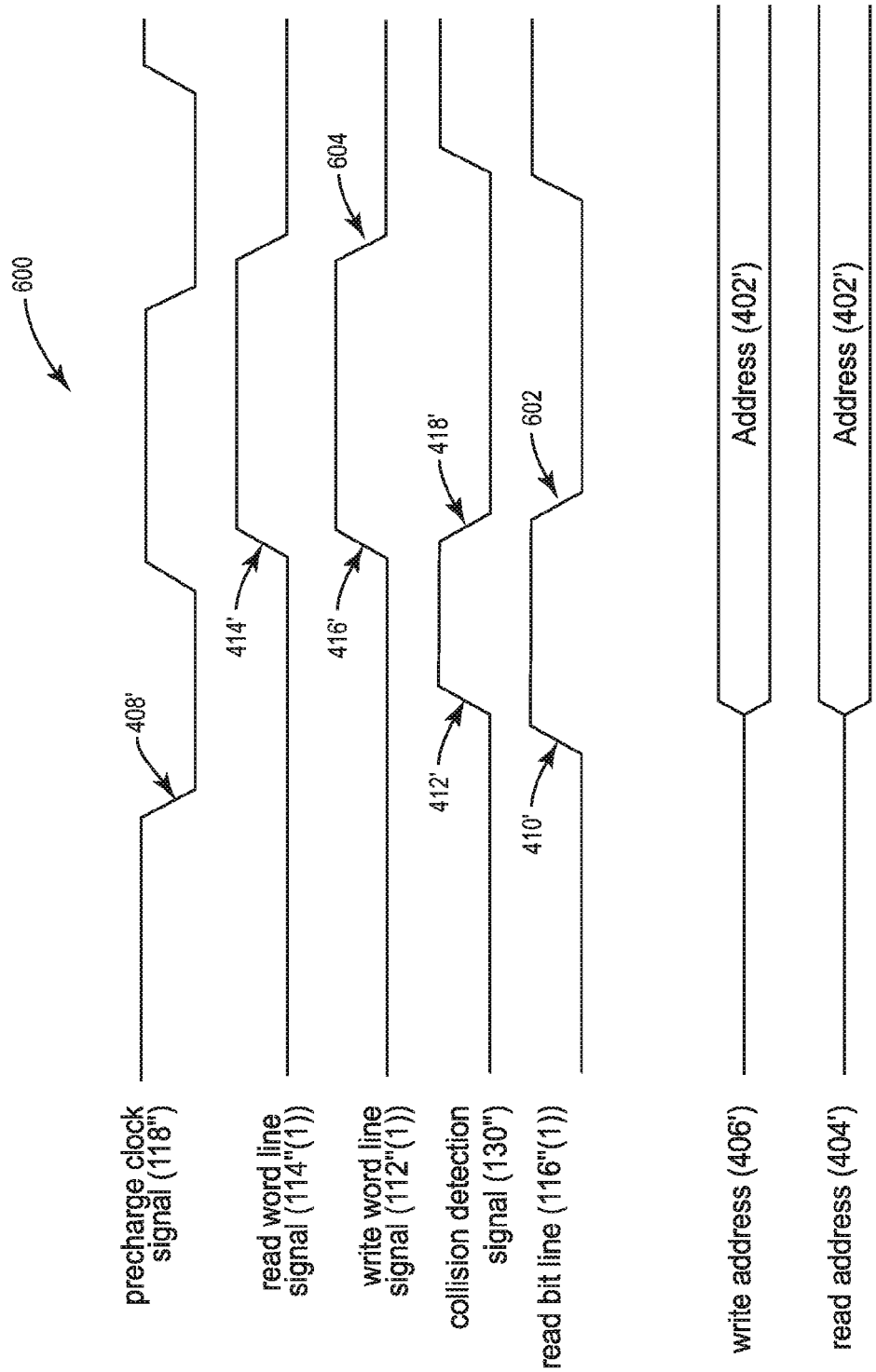
FIG. 6 is a timing diagram illustrating exemplary timings of signals generated by the memory system in FIG. 5 in response to a read-write collision at a memory address.

In this regard, FIG. 6 illustrates an exemplary timing diagram 600 of signals generated by the memory system 500 in FIG. 5 in response to a read-write collision. Notably, transitions/arrows described in relation to the timing diagram 400 in FIG. 4 have an associated number "4XX," while similar elements in the timing diagram 600 in FIG. 6 have an associated number "4XX'," and thus will not be re-described herein.

With continuing reference to FIG. 6, a logic high ('1') value of the write word line signal 112"(1) (transition 416') and the read word line signal 114"(1) (transition 414') activates the first and second NMOS transistors 302'(1), 304'(1), respectively, in the collision detection circuit 128"(1). Thus the collision detection signal 130" is driven to a logic low ('0') value (arrow 418'). The inverter 308' in the collision detection system 102" inverts the collision detection signal 130" and drives the inverted collision detection signal 310' to a logic high (T) value (not shown). However, rather than providing an unknown value X to the read bit line 116"(1), a logic high (T) value of the inverted collision detection signal 310' activates the NMOS transistor 504(1) in the clamping circuit 502(1). Thus, the read bit line 116"(1) is driven to a logic low ('0') value (arrow 602). In other words, in response to the rising transitions 414', 416' of the read and write word line signals 114"(1), 112"(1), respectively, the collision detection signal 130" causes the clamping circuit 502(1) to clamp the read bit line 116"(1) to a known logic low ('0') value. The read bit line 116"(1) is clamped to a known value until the write operation completes, as indicated by a falling transition 604 of the write word line signal 112"(1). Thus, employing the collision detection system 102" with the clamping circuits 502(1)-502(M) mitigates errors caused by read-write collisions in the memory system 500 while reducing power consumption of the memory system 500.

Notably, in addition to the clamping circuits 502(1)-502(M) in the collision detection system 102" in FIG. 5, other aspects may employ alternative clamping circuits. In this regard, FIG. 7 illustrates an exemplary memory system 700 employing an exemplary collision detection system 102'''.

Figure 7:
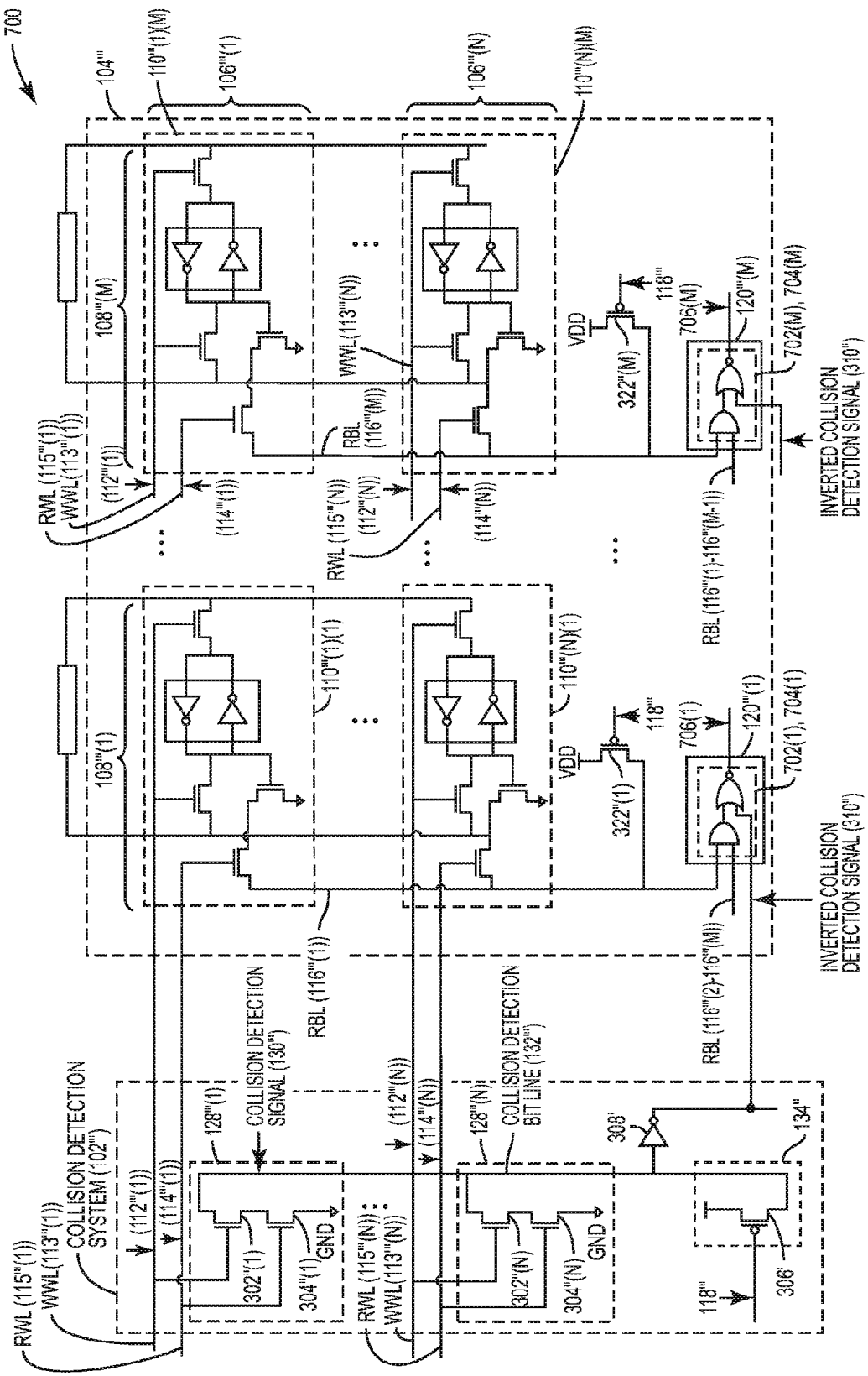
FIG. 7 is a circuit diagram of another exemplary memory system illustrating more detail of a collision detection system configured to detect read-write collisions at memory addresses that additionally employs clamping circuits to reduce power consumption associated with read-write collisions.

Notably, elements associated with the memory system 300 in FIG. 3 have an associated number "X" or "X'," while similar elements in the memory system 700 in FIG. 7 have an associated number "X''" or "X'''," respectively, and thus will not be re-described herein.

With continuing reference to FIG. 7, rather than clamping the read bit line 116'''(1)-116''' (M) using the NMOS transistors 504(1)-504(M) described in FIG. 5, the collision detection system 102''' includes a clamping circuit 702(1)-702(M) in each corresponding downstream logic circuit 120'''(1)-120''' (M). In this aspect, each clamping circuit 702(1)-702(M) employs an AND-OR-INVERT logic gate 704(1)-704(M). In this manner, the AND-OR-INVERT logic gate 704(1)-704(M) is configured to receive the inverted collision detection signal 310" and signals from the corresponding read bit lines 116'''(1)-116'''(M). The AND-OR-INVERT gate 704(1)-704(M) is also configured to provide a clamping signal 706(1)-706(M) so as to deactivate circuit components employed in the downstream logic circuit 120'''(1)-120''' (M) such that crowbar current is reduced or avoided in the downstream logic circuit 120'''(1)-120'''(M) in a similar manner as described in relation to FIG. 5. Further, each AND-OR-INVERT logic gate 704(1)-704(M) may be used to combine the read bit lines 116'''(1)-116'''(M) as part of a larger memory hierarchy. Thus, employing the collision detection system 102''' with the clamping circuits 702(1)-702(M) mitigates errors caused by read-write collisions in the memory system 700 while reducing power consumption of the memory system 700.

The collision detection systems for detecting read-write collisions in memory arrays after word line activation, and related systems and methods, according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player and an automobile.

Figure 8:
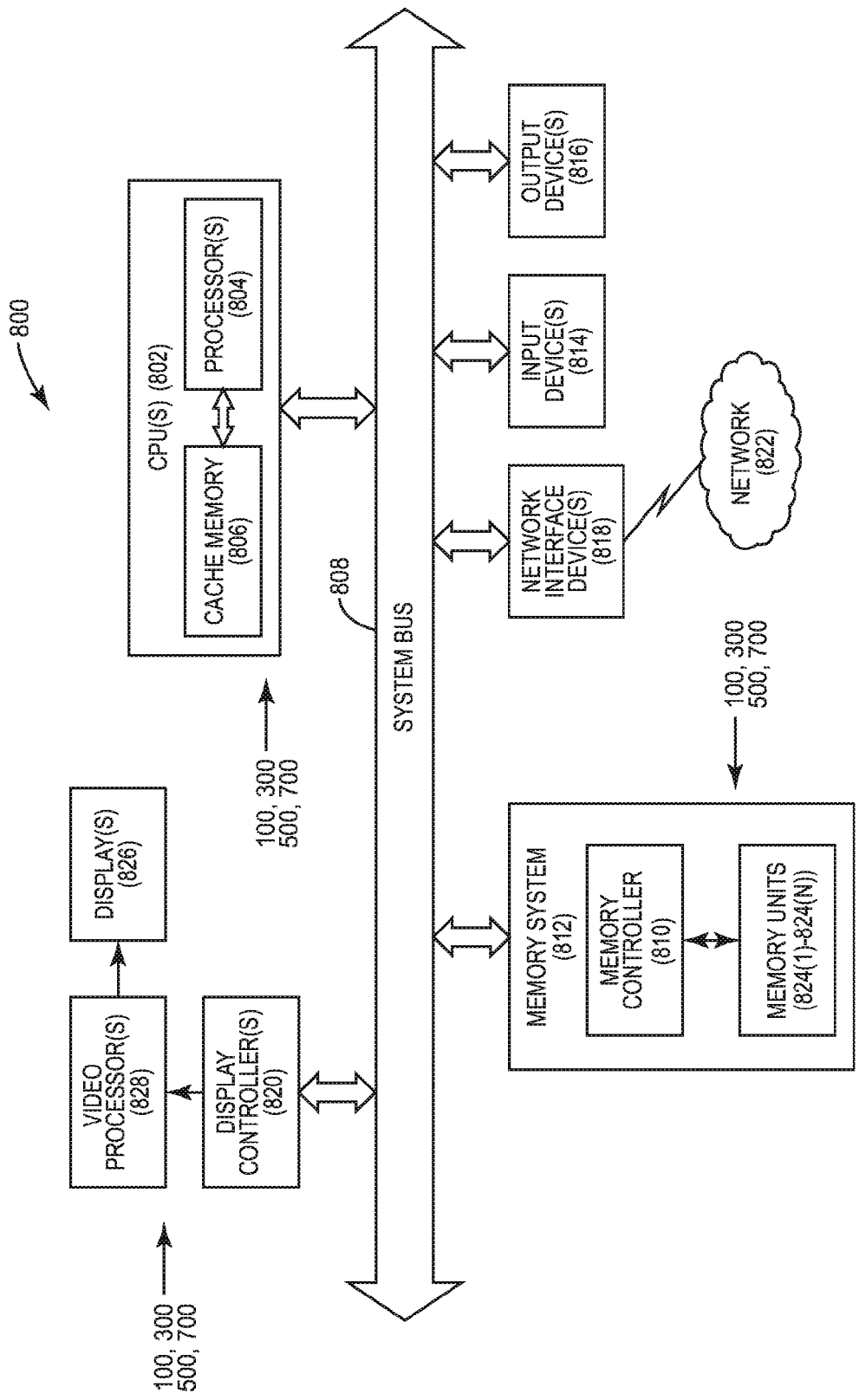
FIG. 8 is a block diagram of an exemplary processor-based system that can include the collision detection systems described herein, including but not limited to the collision detection systems in FIGS. 1, 3, 5, and 7.

In this regard, FIG. 8 illustrates an example of a processor-based system 800 that can include the memory systems 100, 300, 500, and 700 employing the collision detection systems 102, 102', 102", and 102''', respectively, to detect read-write collisions after word line activation without decreasing performance during every read operation. In this example, the processor-based system 800 includes one or more central processing units (CPUs) 802, each including one or more processors 804. The CPU(s) 802 may have cache memory 806 coupled to the processor(s) 804 for rapid access to temporarily stored data. The CPU(s) 802 is coupled to a system bus 808 and can intercouple master and slave devices included in the processor-based system 800. As is well known, the CPU(s) 802 communicates with these other devices by exchanging address, control, and data information over the system bus 808. For example, the CPU(s) 802 can communicate bus transaction requests to a memory controller 810 as an example of a slave device. Although not illustrated in FIG. 8, multiple system buses 808 could be provided, wherein each system bus 808 constitutes a different fabric.

Other master and slave devices can be connected to the system bus 808. As illustrated in FIG. 8, these devices can include a memory system 812, one or more input devices 814, one or more output devices 816, one or more network interface devices 818, and one or more display controllers 820, as examples. The input device(s) 814 can include any type of input device, including but not limited to input keys, switches, voice processors, etc. The output device(s) 816 can include any type of output device, including but not limited to audio, video, other visual indicators, etc. The network interface device(s) 818 can be any device configured to allow exchange of data to and from a network 822. The network 822 can be any type of network, including but not limited to a wired or wireless network, a private or public network, a local area network (LAN), a wireless local area network (WLAN), a wide area network (WAN), a BLUETOOTH™ network, or the Internet. The network interface device(s) 818 can be configured to support any type of communications protocol desired. The memory system 812 can include one or more memory units 824(1)-824(N).

The CPU(s) 802 may also be configured to access the display controller(s) 820 over the system bus 808 to control information sent to one or more displays 826. The display controller(s) 820 sends information to the display(s) 826 to be displayed via one or more video processors 828, which process the information to be displayed into a format suitable for the display(s) 826. The display(s) 826 can include any type of display, including but not limited to a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A collision detection system comprising:
   one or more collision detection circuits, wherein each collision detection circuit of the one or more collision detection circuits corresponds to a bit cell row in a memory array and is configured to:
      receive a write word line signal corresponding to the bit cell row;
      receive a read word line signal corresponding to the bit cell row; and
      generate a collision detection signal in response to the write word line signal having an active state when the read word line signal also has an active state; and
   a pre-charge circuit configured to drive the collision detection signal to an inactive state in response to a pre-charge clock signal.

2. The collision detection system of claim 1, further configured to provide the collision detection signal to each client of a plurality of clients associated with a memory system.

3. The collision detection system of claim 1, further comprising one or more clamping circuits, wherein:
   each clamping circuit of the one or more clamping circuits corresponds to a bit cell column; and
   each clamping circuit of the one or more clamping circuits is configured to drive a read bit line of the corresponding bit cell column to an evaluate state in response to the collision detection signal.

4. The collision detection system of claim 3, wherein each clamping circuit of the one or more clamping circuits comprises an NMOS transistor, comprising:
   a source configured to receive a ground voltage;
   a gate configured to receive an inverted collision detection signal; and
   a drain coupled to the read bit line of the corresponding bit cell column.

5. The collision detection system of claim 3, wherein each clamping circuit of the one or more clamping circuits comprises an AND-OR-INVERT gate configured to:
   receive the collision detection signal;
   receive a signal from the corresponding read bit line; and
   provide a clamping signal to deactivate circuit components employed in a downstream logic circuit such that crowbar current is reduced or avoided in the downstream logic circuit.

6. The collision detection system of claim 1, wherein each collision detection circuit of the one or more collision detection circuits comprises:
   a first n-type metal-oxide semiconductor (NMOS) transistor comprising:
      a source configured to receive a ground voltage;
      a gate configured to receive the corresponding read word line signal; and
      a drain; and
   a second NMOS transistor comprising:
      a source coupled to the drain of the first NMOS transistor;
      a gate configured to receive the corresponding write word line signal; and
      a drain coupled to a collision detection bit line, the collision detection bit line configured to receive the collision detection signal.

7. The collision detection system of claim 1, wherein the pre-charge circuit comprises a p-type metal-oxide semiconductor (PMOS) transistor comprising:
   a source configured to receive a supply voltage;
   a gate configured to receive the pre-charge clock signal; and
   a drain coupled to a collision detection bit line, the collision detection bit line configured to receive the collision detection signal.

8. The collision detection system of claim 1, further comprising an inverter configured to:
   receive the collision detection signal; and
   provide an inverted collision detection signal.

9. The collision detection system of claim 1 integrated into an integrated circuit (IC).

10. The collision detection system of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

11. A method for detecting read-write collisions, comprising:
   receiving a write word line signal corresponding to a bit cell row;
   receiving a read word line signal corresponding to the bit cell row;
   generating a collision detection signal in response to the write word line signal having an active state when the read word line signal also has an active state; and
   driving the collision detection signal to an inactive state in response to a pre-charge clock signal.

12. The method of claim 11, further comprising providing the collision detection signal to each client of a plurality of clients associated with a memory system.

13. The method of claim 11, further comprising driving a read bit line of a corresponding bit cell column to an evaluate state in response to the collision detection signal.

14. The method of claim 13, further comprising providing a clamping signal to deactivate circuit components employed in a downstream logic circuit such that crowbar current is reduced or avoided in the downstream logic circuit.

15. A collision detection system, comprising:
   means for receiving a write word line signal corresponding to a bit cell row;
   means for receiving a read word line signal corresponding to the bit cell row;
   means for generating a collision detection signal in response to the write word line signal having an active state when the read word line signal also has an active state; and
   means for driving the collision detection signal to an inactive state in response to a pre-charge clock signal.

16. The collision detection system of claim 15, further comprising means for providing the collision detection signal to each client of a plurality of clients associated with a memory system.

17. The collision detection system of claim 15, further comprising means for driving a read bit line of a corresponding bit cell column to an evaluate state in response to the collision detection signal.

18. A collision detection system comprising:
   one or more collision detection circuits, wherein each collision detection circuit of the one or more collision detection circuits corresponds to a bit cell row in a memory array and comprises:
      a first n-type metal-oxide semiconductor (NMOS) transistor configured to receive a write word line signal corresponding to the bit cell row; and
      a second NMOS transistor configured to receive a read word line signal corresponding to the bit cell row;
      the first NMOS transistor arranged in series with the second NMOS transistor such that the corresponding collision detection circuit generates a collision detection signal in response to the write word line signal having an active state when the read word line signal also has an active state.

19. The collision detection system of claim 18 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

* * * * *